(12) United States Patent
Ishiwara et al.

(10) Patent No.: US 6,420,745 B2
(45) Date of Patent: Jul. 16, 2002

(54) NONVOLATILE FERROELECTRIC MEMORY AND ITS MANUFACTURING METHOD

(75) Inventors: Hiroshi Ishiwara; Koji Aizawa, both of Tokyo (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 0 days.

(21) Appl. No.: 09/838,042

(22) Filed: Apr. 18, 2001

Related U.S. Application Data

(63) Continuation of application No. PCT/JP00/05719, filed on Aug. 24, 2000.

(30) Foreign Application Priority Data

Aug. 26, 1999 (JP) .............................. 11-239943

(51) Int. Cl.[7] .............................. H01L 29/72
(52) U.S. Cl. ..................... 257/295; 257/296; 257/300; 257/303; 257/306; 257/310; 438/206; 438/210; 438/212; 438/238; 438/268; 438/314; 365/145
(58) Field of Search ................ 257/295, 296, 257/300, 303, 306, 310; 438/206, 210, 212, 238, 268, 314; 365/145

(56) References Cited

U.S. PATENT DOCUMENTS 5,049,956 A 9/1991 Yoshida et al.
6,054,730 A * 4/2000 Noguchi ..................... 257/306
6,188,600 B1 2/2001 Ishiwara

FOREIGN PATENT DOCUMENTS

| JP | 8-204032 | 8/1996 |
| JP | 10-27856 | 1/1998 |
| JP | 10-242856 | 9/1998 |

OTHER PUBLICATIONS

Kawasaki, T. et al., "MFMIS Structure for Nonvolatile Ferroelectric Memory Using PZT Thin Film," IEICE Trans. Electron., vol. E81–C, No. 4, Apr. 1998.

* cited by examiner

Primary Examiner—Edward Wojciechowicz
(74) Attorney, Agent, or Firm—Christensen O'Connor Johnson Kindness PLLC

(57) ABSTRACT

A nonvolatile semiconductor memory, including a ferroelectric capacitor connected to the gate of a MOSFET, comprises a silicon thin film formed in stripes on an insulated substrate and having an $n^+$-region, a p-region and an $n^+$-region layered in its thickness direction, a hole formed in a portion of the silicon thin film and extending to the lower $n^+$-region, a gate electrode provided on the side walls of the hole with a gate insulting film interposed therebetween, and a ferroelectric capacitor formed on the silicon thin film and having its lower electrode connected to the gate electrode.

13 Claims, 6 Drawing Sheets

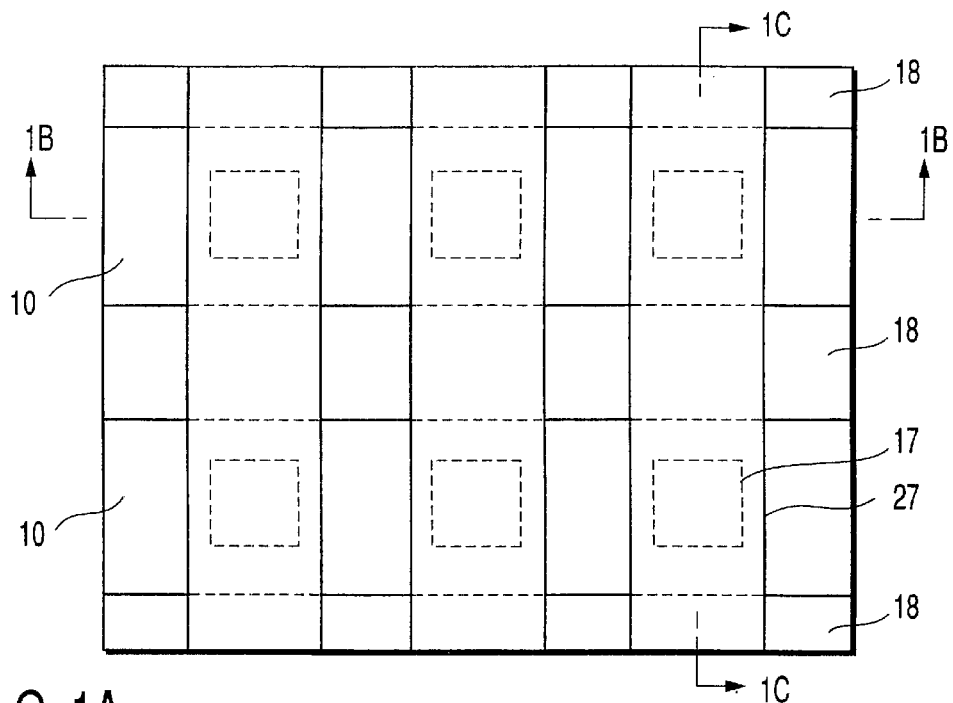
F I G. 1A
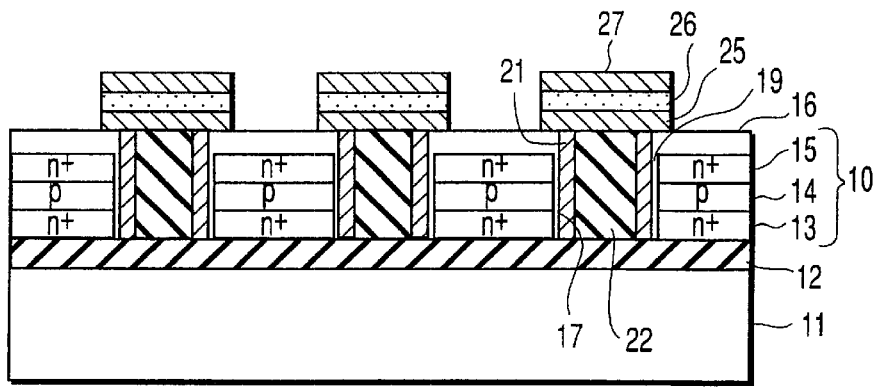
F I G. 1B
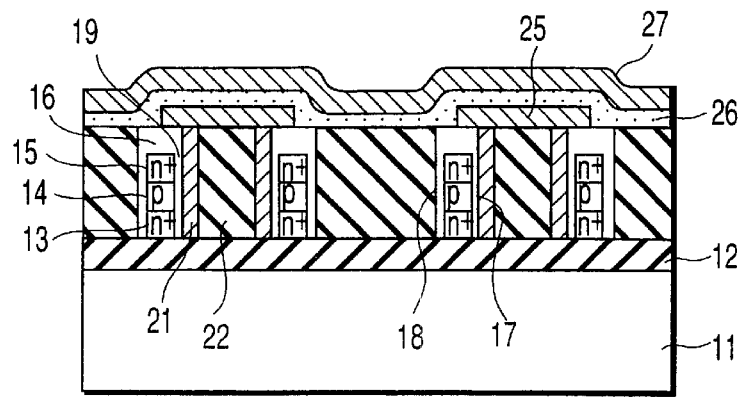
F I G. 1C

NONVOLATILE FERROELECTRIC MEMORY AND ITS MANUFACTURING METHOD

CROSS REFERENCE TO RELATED APPLICATIONS

This is a Continuation Application of PCT Application No. PCT/JP00/05719, filed Aug. 24, 2000, which was not published under PCT Article 21(2) in English.

This application is based upon and claims the benefit of priority from the prior Japanese Patent Application No. 11-239943, filed Aug. 26, 1999, the entire contents of which are incorporated herein by reference.

BACKGROUND OF THE INVENTION

This invention relates to a nonvolatile ferroelectric memory, and more particularly to a nonvolatile ferroelectric memory having ferroelectric capacitors connected to the gates of field effect transistors having an MOS or MIS structure, and a method for manufacturing this memory.

In recent years, an MFS-FET (Metal Ferroelectric Semiconductor Field-Effect Transistor), in which the gate insulation film of a MOSFET is formed of a ferroelectric material, is expected as a key device for realizing a next-generation ferroelectric memory that does not require rewriting each time reading is executed. However, when an MFS capacitor or an MFS-FET is created by directly depositing a ferroelectric film on a substrate made of a semiconductor such as Si, counter diffusion occurs between components contained therein, thereby interrupting the formation of an electrically satisfactory interface.

To avoid this, generally used is an MFIS (Metal Ferroelectric materials Insulating materials Semiconductor) structure, in which an ordinary dielectric buffer layer is inserted between a ferroelectric film and a semiconductor substrate, or an MFMIS (Metal Ferroelectric material Metal Insulating material Semiconductor) structure, in which a conductive diffusion preventing layer is further inserted between the ferroelectric film and the buffer layer. In particular, in the latter structure, a ferroelectric capacitor is connected on a usual MOS- or MIS-FET, and is characterized in that the area ratio therebetween can be optimized.

Research on the optimization of the ratio between the area of the gate section of a MOS or MIS and the area of a ferroelectric capacitor is disclosed in, for example, a document "MFMIS Structure for Nonvolatile Ferroelectric Memory Using PZT Thin Film" written by T. Kawasaki, Y. Akiyama, S. Fujita and S. Satoh, and published in IEICE TRANS. ELECTRON., VOL. E81-C, NO. 4, PP584–589 (APRIL 1998). Further, the inventors of the present invention have obtained experimental results as shown in FIG. 8.

FIGS. 8A and 8B illustrate examples of measurement results concerning the C–V (Capacitance-Voltage) characteristic, obtained by connecting, in series, a ferroelectric capacitor including $SrBi_2TaO_9$ and Pt electrodes, to a MOS capacitor. Hysteresis based on the ferroelectricity of the $SrBi_2TaO_9$ film is found in the C–V characteristic results shown in the figures. FIG. 8A shows a case where both capacitors have the same area, in which the width of hysteresis is narrow. On the other hand, FIG. 8B shows a case where the area of the MOS capacitor is four times that of the ferroelectric capacitor. In this case, the width of hysteresis is wide, which means a satisfactory characteristic.

As understood from the experimental results, the ferroelectric film usually used in a memory has a higher relative dielectric constant and can induce a larger amount of charge per unit area than, for example, an $SiO_2$ layer that is typically used as a buffer layer. Accordingly, to effectively apply a voltage to the ferroelectric film and to balance the amount of charge, it is important to make the area of the MOS capacitor large and the area of the ferroelectric capacitor small. The same relationship is seen even if the MOS capacitor is replaced with a FET. In order to enhance the performance of an MFMIS-FET, it is necessary to increase the area of its gate section. The optimal area ratio between the gate section and the ferroelectric capacitor is generally about 3–10, although it depends upon a material or structure employed.

Three methods can be considered for increasing the area of the gate section of a MOS- or MIS-FET—1. a method for increasing the channel length of the FET, 2. a method for increasing the channel width of the FET, and 3. a method for extending its gate electrode up to its source/drain region, with the channel length and channel width unchanged. However, the first method is disadvantageous in that the driving current of the FET decreases. The third method is disadvantageous in that its parasitic capacitance increases and hence its operation speed lowers. To increase the area of the gate section without raising such problems, it is important to increase the channel width, i.e. the gate width, as in the second method.

U.S. patent application Ser. No. 09/379,522 filed Aug. 23, 1999, by the same inventors as the present application, for example, discloses a nonvolatile ferroelectric memory of a structure in which MOS- or MIS-FETs are assembled by forming an Si thin film in stripes on an insulated substrate, and ferroelectric capacitors are provided on the resultant structure. In this memory structure, however, the gate width direction of each MOS- or MIS-FET is parallel to the Si stripes. Accordingly, if the gate width is widened, each FET occupies a long portion of each Si stripe, which makes it impossible to form a highly-integrated ferroelectric memory. Specifically, if the gate area is ten times the area of the ferroelectric capacitor, the degree of integration is reduced to about one tenth.

Thus, in the conventional nonvolatile ferroelectric memory, in order to enhance its performance, it is necessary to enlarge the gate area as compared to the ferroelectric capacitor area. However, the wider the gate width is made so as to increase the gate area, the lower the integration of the memory.

BRIEF SUMMARY OF THE INVENTION

It is the object of the invention to provide a highly-integrated nonvolatile ferroelectric memory having an optimal element structure of high performance, which employs MOS- or MIS-FETs of a wide gate width.

The present invention provides a nonvolatile ferroelectric memory that comprises MOS-type or MIS-type field effect transistors assembled by a silicon thin film formed in stripes on an insulated substrate, and ferroelectric capacitors layered on the silicon thin film in the thickness direction thereof, wherein one or a plurality of ferroelectric capacitors are connected to the gate electrodes of the transistors, whereby the source, channel and drain regions of each transistor are formed in the thickness direction of the silicon thin film.

According to a first example of the invention, there is provided a nonvolatile ferroelectric memory, which employs a laminated structure wherein: an n-region, a p-region and another n-region (or a p-region, an n-region and another p-region) are formed in this order from the bottom in the thickness direction of the silicon thin film; an insulation film is provided on side walls of a hole formed in the silicon thin film and at least extending to the n-region (or p-region); the lower and upper n-regions (or p-regions) are used as the source and drain of the transistor, respectively; the intermediate p-region (or n-region) is used as the channel of the transistor; and the insulation film on the side walls of the hole is used as a gate insulation film.

According to a second example of the invention, there is provided a nonvolatile ferroelectric memory, in which: a silicon thin film has a laminated structure wherein an n-region and a p-region (or a p-region and an n-region) are formed in this order from the bottom in the thickness direction of the silicon thin film; a conductive electrode is provided on the silicon thin film in a direction substantially perpendicular to a direction in which the silicon thin film is formed in stripe; an insulation film is formed on the side walls of a hole formed in an intersection between the conductive electrode and the silicon thin film and extending from the upper surface of the conductive electrode at least to the lower n-region (or p-region); the lower n-region (or p-region) is used as the source or drain of a transistor; the p-region (or n-region) thereon is used as the channel of the transistor; the conductive electrode is used as the drain or source of the transistor; and the insulation film on the side walls of the hole is used as a gate insulation film.

According to a third example of the invention, there is provided a nonvolatile ferroelectric memory, in which a conductive electrode contains an impurity that serves as a donor or acceptor with respect to a silicon thin film; an n-region (or p-region) is formed on the conductive electrode by diffusing the impurity into the silicon thin film at an intersection portion by a heat treatment; and the n-region (or p-region) formed at the intersection portion by the heat treatment is used as the drain or source.

The conductive electrode is made of polysilicon, a metal silicide, or a pure metal, etc.

In the present invention, source, channel and drain regions are formed in a silicon thin film on an insulated substrate in the thickness direction of the thin film, thereby constituting a so-called tandem-type transistor. In this structure, the substantial gate width of each transistor can be widened without reducing the degree of integration. As a result, the nonvolatile ferroelectric memory including MOS- or MIS-type field effect transistors and ferroelectric capacitors connected thereto can have an optimal element structure of high performance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A–1C are plan and sectional views illustrating the element structure of a nonvolatile ferroelectric memory according to a first embodiment;

DETAILED DESCRIPTION OF THE INVENTION

Figure 2A:
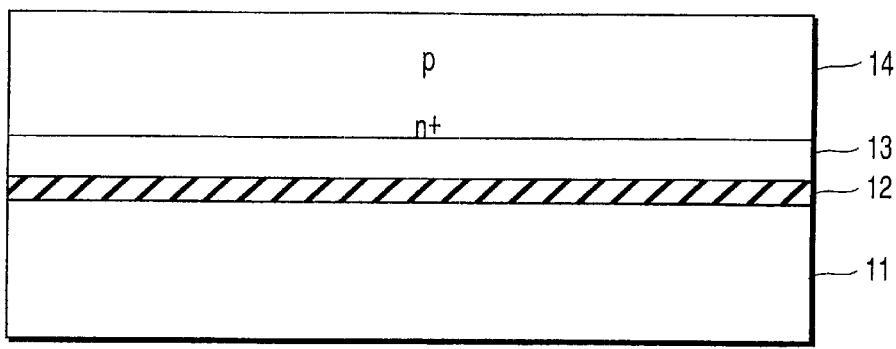
FIGS. 2A–2E are sectional views illustrating semiconductor structures appearing in respective processes for manufacturing the nonvolatile ferroelectric memory of the first embodiment.

The invention will be described in detail with reference to the embodiments shown in the figures.

FIGS. 1A–1C are views useful in explaining the element structure of a nonvolatile ferroelectric memory according to a first embodiment. FIG. 1A is a plan view, FIG. 1B is a sectional view taken along line 1B—1B, and FIG. 1C is a sectional view taken along line 1C—1C.

An Si thin film 10 including an $n^+$-region 13, a p-region 14 and an $n^+$-region 15 layered upon one another is provided on an insulated substrate that is obtained by forming an $SiO_2$ film 12 on an Si wafer 11. The $SiO_2$ film 10 is formed into stripes by providing therein grooves 18. Holes 17 smaller than the width of each stripe are formed in each stripe at regular intervals. A gate insulation film 19 made of $SiO_2$ is provided on the side surfaces of each hole 17, and a gate electrode 21 is formed on the gate insulation film 19, thereby forming a MOSFET.

Further, a ferroelectric capacitor including a lower electrode 25, a ferroelectric film 26 made of, for example, PZT, and an upper electrode 27, which are layered upon one another, is provided on each hole 17 of the Si (silicon) thin film 10. The lower electrode 25 of each capacitor is connected to the gate electrode 21, while the upper electrode 27 extends in a direction perpendicular to a corresponding Si (silicon) stripe.

Furthermore, an $SiO_2$ film (protective insulation film) 16 is provided on the Si thin film 10 for protecting the Si thin film 10. The holes 17 and the grooves 18 are each filled with an $SiO_2$ film (buried insulation film) 22.

Referring to FIGS. 2A–2E, the process of manufacturing the nonvolatile ferroelectric memory of this embodiment will be described.

First, as shown in FIG. 2A, an SOI substrate (Silicon On Insulator substrate: a substrate obtained by forming an Si thin film on an insulator substrate), which includes an $n^+$-region (an n-region of a high impurity density) 13 and a p-region 14 formed on an $SiO_2$ film 12 that is provided on an Si wafer 11, is used as an element forming substrate. To prepare this substrate, the p-type or n-type Si (silicon) wafer 11 coated with the $SiO_2$ film 12 is adhered to the p-type Si wafer 14 coated with the $n^+$-region 13, using a direct adhesion technique.

Figure 2B:
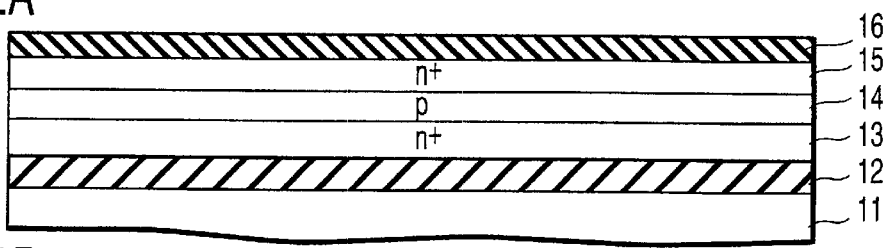

Subsequently, as shown in FIG. 2B, the p-type Si wafer 14 is thinned to a desired thickness to form a p-region, an $n^+$-region 15 is formed thereon, and an $SiO_2$ film 16 of about 0.2–0.5 μm thick is formed thereon.

Figure 2C:
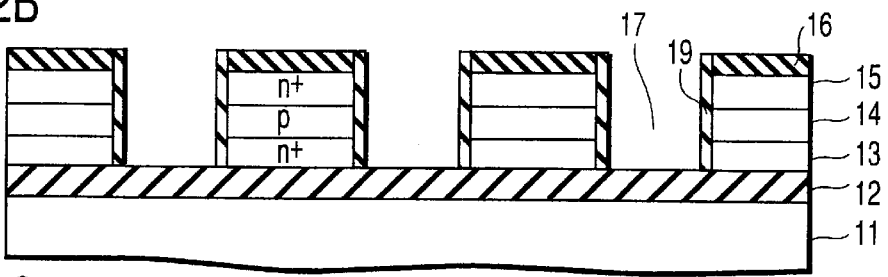
Figure 3:
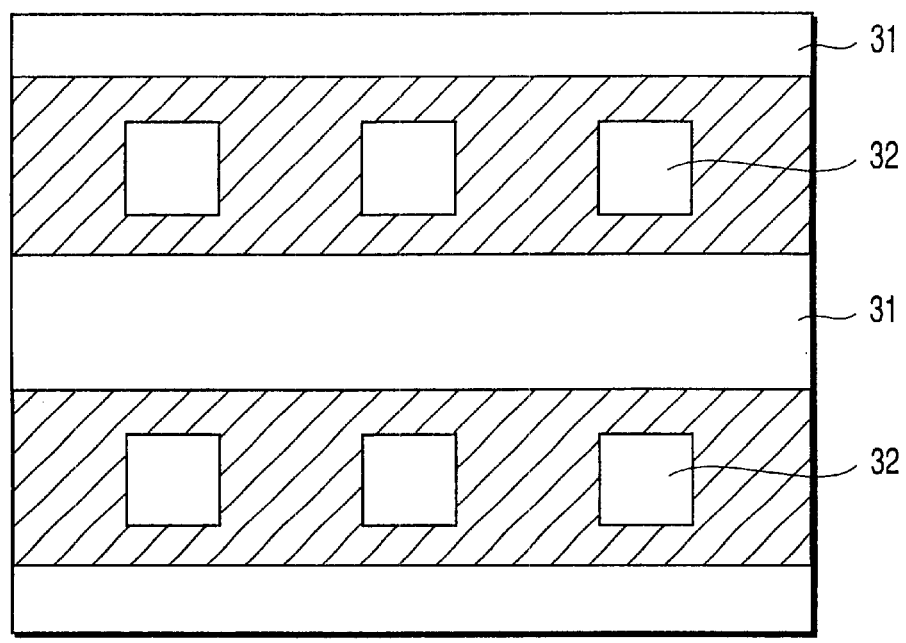
FIG. 3 is a plan view showing a mask pattern used for manufacturing the nonvolatile ferroelectric memory of the first embodiment.

After that, the Si thin film 10 is etched into stripes, using a mask having stripe openings 31 and rectangular openings 32 as shown in FIG. 3, and holes 17 for providing gate sections are formed as shown in FIG. 2C. The reason why a number of holes 17 are formed along each Si stripe is that they enable FETs to be formed in a matrix.

The holes 17 extend to the lower $SiO_2$ film 12. Simultaneous forming of the stripes and the holes 17 can do without a margin for masking and hence realize high integration. When forming the holes 17 in a process different from the process of forming the stripes, it is not always necessary to extend the holes to the lower $SiO_2$ film 12. It is sufficient if they reach the $n^+$-region 13.

Thereafter, insulation films 19 such as thin oxide or nitride films of 5–10 nm thick are formed on the side walls of the stripes of the Si thin film 10 and on the side walls of the holes 17. At this time, thermal oxide films are used as the insulation films 19, and will serve as the gate insulation films of MOSFETs.

Figure 2D:
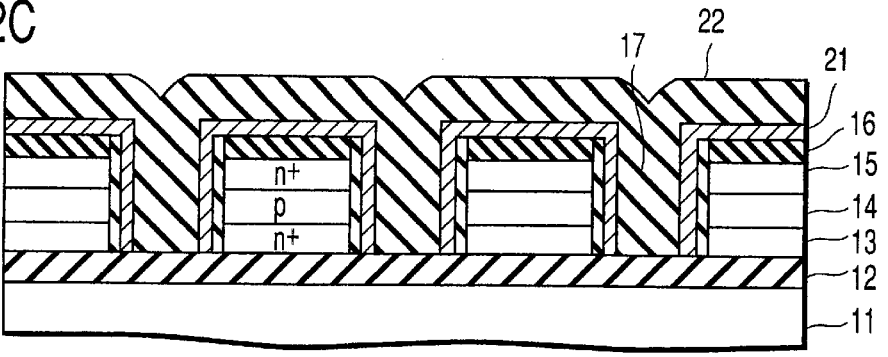

Then, as shown in FIG. 2D, conductive films 21 of a thickness that do not completely fill the holes 17 are provided on the insulation films 19 by deposition, and an $SiO_2$ film 22 is finally filled in central portions of the holes 17 and in gaps (grooves 18) between the Si stripes. The conductive film 21 can be formed of a metal film or a polycrystalline Si film. In this embodiment, it is formed of a low-resistance polycrystalline Si film doped with a great amount of impurity. The $SiO_2$ film 22 is filled in central portions of the holes 17 and in gaps between the Si stripes for the purpose of securing electrical isolation between the Si stripes. If the gaps between the Si stripes are wide, the holes 17 may be completely filled with the polycrystalline Si film.

Figure 2E:
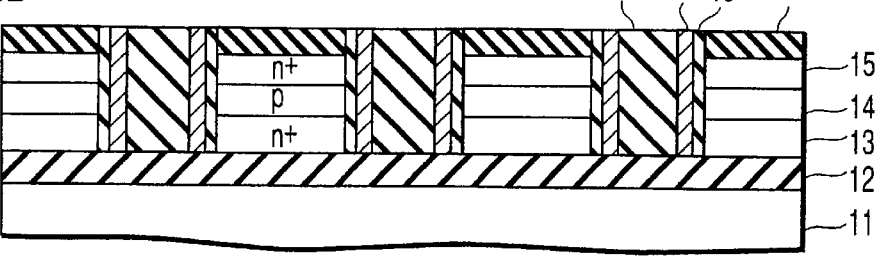

Then, as shown in FIG. 2E, the $SiO_2$ film 22 and the polycrystalline films 21 are polished by chemical mechanical polishing (CMP). when the $SiO_2$ films 16 are exposed, the polishing is stopped. Since the $SiO_2$ films 16 are sufficiently thick, if, at first, the top $SiO_2$ film 22 is removed using a polishing solution capable of efficiently removing $SiO_2$ films, and then the polycrystalline Si films 21 are removed using another polishing solution, the CMP process can be stopped at the exposing of the lower $SiO_2$ films 16.

After polishing, the metal films, deposited in the holes 17, and the upper ends of the polycrystalline Si films 21 are exposed. Accordingly, if the lower electrodes 25 of the ferroelectric capacitors are formed on the resultant structure, they are connected to the gate electrodes 21 of the MOSFETs.

Figure 4:
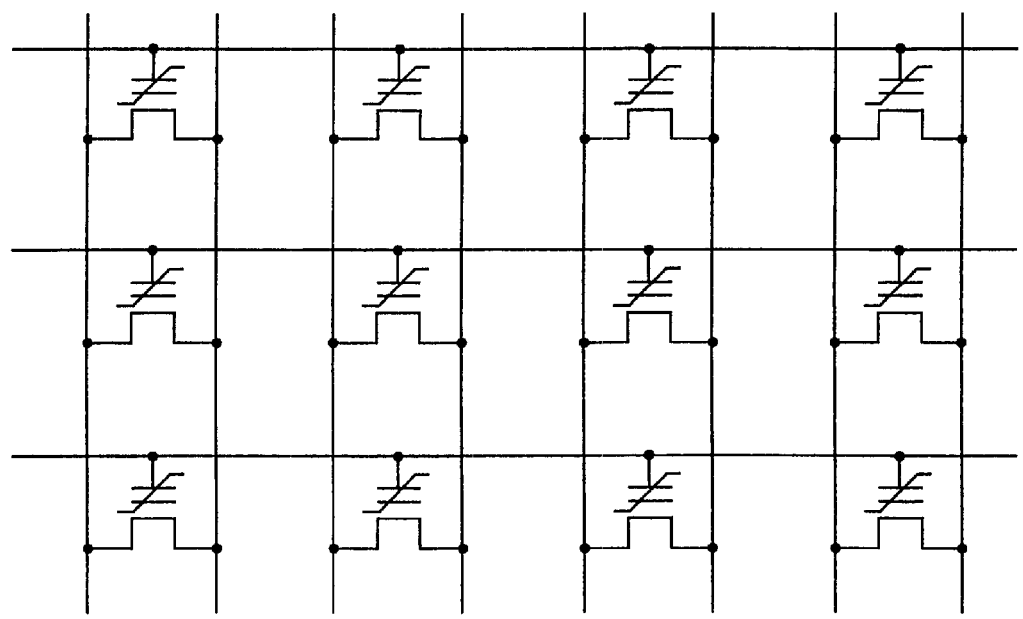
FIG. 4 is a diagram illustrating the circuit structure of the nonvolatile ferroelectric memory of the first embodiment.

Finally, a ferroelectric film 26 made of PZT ($PbZr_x Ti_{1-x}O_3$) and a layer for upper electrodes 27 are deposited, and have their unnecessary portions etched, thereby providing a structure as shown in FIGS. 1A to 1C. In the figure, the upper electrodes 27 intersect the Si stripes, and this structure corresponds to a memory structure disclosed in Japanese Patent Application No. 10-242856, which employs only first-layer wiring. Further, FIG. 4 shows a circuit equivalent to that of the memory shown in FIGS. 1A–1C. This circuit has the same function as a standard ferroelectric memory or a self-learning sum-of-products calculation circuit.

As described above, in the embodiment, the Si thin film 10 has a three-layer structure of the $n^+$-region 13, the p-region 14 and the $n^+$-region 15 layered in the thickness direction of the Si thin film 10, and the gate insulation films 19 serving as the gate electrodes 21 are provided on the side surfaces of the holes 17 formed in the Si thin film 10. Since, in this case, the gate electrodes 21 are tubular corresponding to the shape of the holes 17, and the entire circumference of each hole 17 serves as the gate width, the gate width can be made much wider than in a structure in which gate electrodes are formed on the Si thin film 10. Accordingly, the area ratio between the gate and the ferroelectric capacitor can be optimized without reducing the degree of integration, thereby realizing a nonvolatile ferroelectric memory of a high performance.

Figure 5:
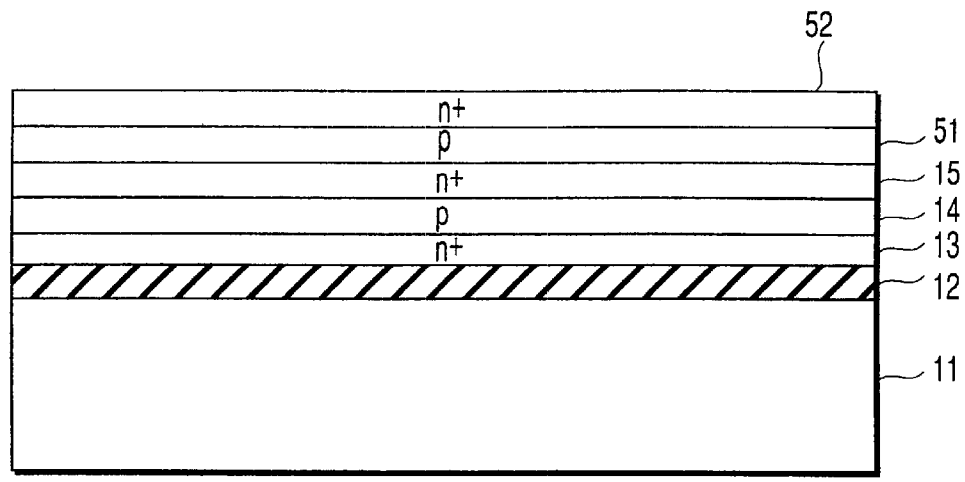
FIG. 5 is a sectional view illustrating an SOI structure employed in a modification of the first embodiment.

Although, in this embodiment, each MOSFET is created using the SOI substrate shown in FIG. 2B, thereby increasing its gate width, the gate width of each MOSFET can be further increased using an SOI structure as shown in FIG. 5. Specifically, a p-region 51 and an $n^+$-region 52 are layered upon the SOI structure shown in FIG. 2B. In this structure in which FETs are stacked in two stages, the upper and lower $n^+$-regions 13 and 52 are used as a source, and the intermediate $n^+$-region 15 is used as a drain, thereby doubling the gate width of the FET.

Figure 6:
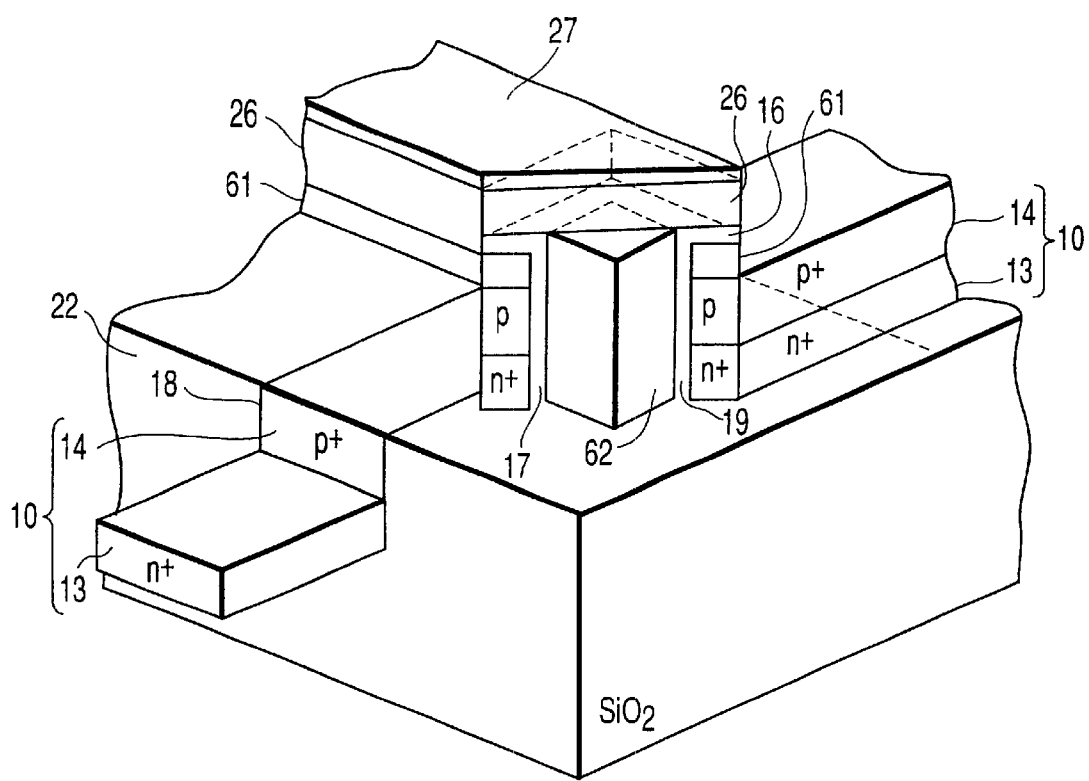
FIG. 6 is a perspective view of a portion of the element structure of a nonvolatile ferroelectric memory according to a second embodiment.

FIG. 6 is a perspective view partly broken, illustrating the element structure of a nonvolatile ferroelectric memory according to a second embodiment. In this figure, the same elements as those shown in FIG. 1 are denoted by the same reference numerals, and no detailed description is given thereof.

In this embodiment, a conductive electrode 61 is used in place of the $n^+$-region 15 employed in the first embodiment. The conductive electrode 61 can be made of polycrystalline Si, metal silicide, a pure metal, etc. This case employs polycrystalline Si.

The second embodiment employs, as in the first embodiment, an SOI substrate including the $n^+$-region 13 and the p-region 14 formed in this order on the $SiO_2$ film. After etching, into stripes, the Si thin film 10 including the $n^+$-region 13 and the p-region 14, the grooves 18 are filled with the $SiO_2$ film 22, and the $SiO_2$ film 22 is flattened by CMP to be level with the Si stripes 10.

Subsequently, conductive electrodes 61 of polycrystalline Si are formed in stripes such that they substantially intersect the Si stripes 10, and are entirely covered with an insulation film 16 such as an oxide or nitride film. Thereafter, insulation films 19 formed of thin oxide films of 5–10 nm thick are provided on the side surfaces of the holes 17. Then, a conductive film, such as a polycrystalline Si film 62 doped with an impurity, is deposited in each hole 17, and the resultant structure is polished by CMP so that the polycrystalline Si film 62 remains only in each hole 17. The later process is similar to that of the first embodiment. Each resultant polycrystalline Si film 62 serves as a gate electrode and is connected to the ferroelectric film 26 of a corresponding ferroelectric capacitor.

Figure 7:
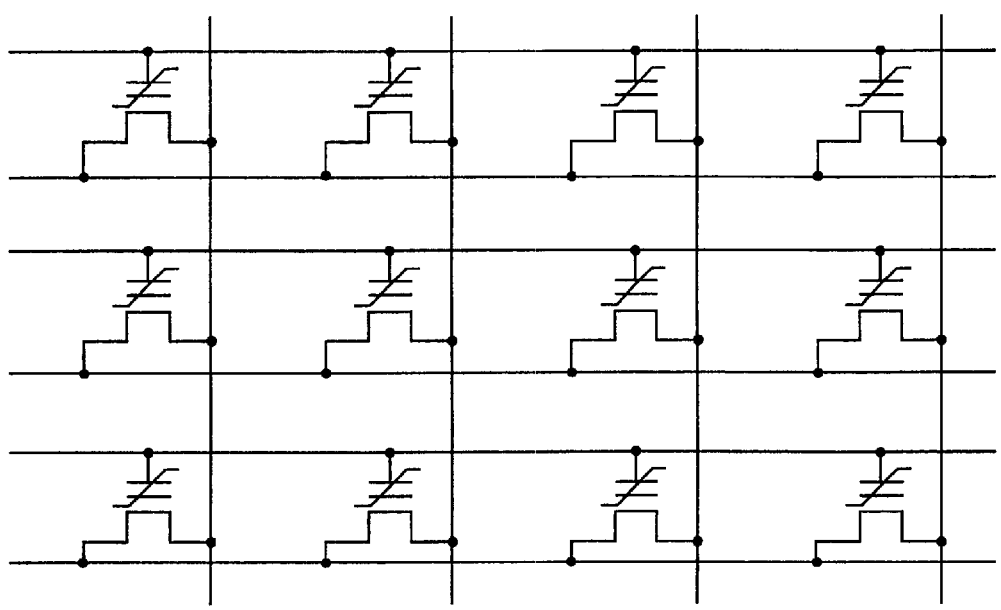
FIG. 7 is a diagram illustrating the circuit structure of the nonvolatile ferroelectric memory of the second embodiment.
Figure 8A:
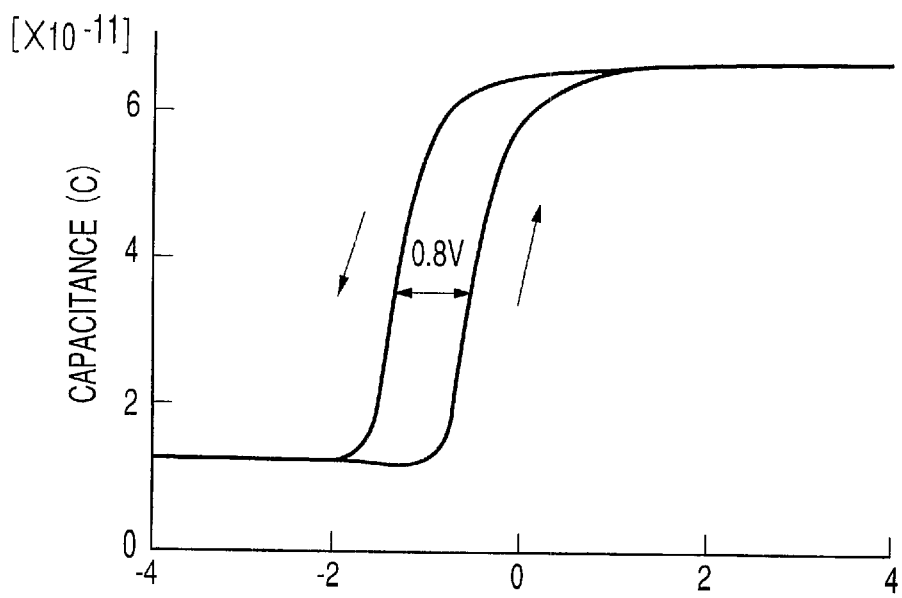
FIGS. 8A and 8B are views illustrating examples of the C–V characteristic of a structure in which a ferroelectric capacitor is connected in series to a MOS capacitor.
Figure 8B:
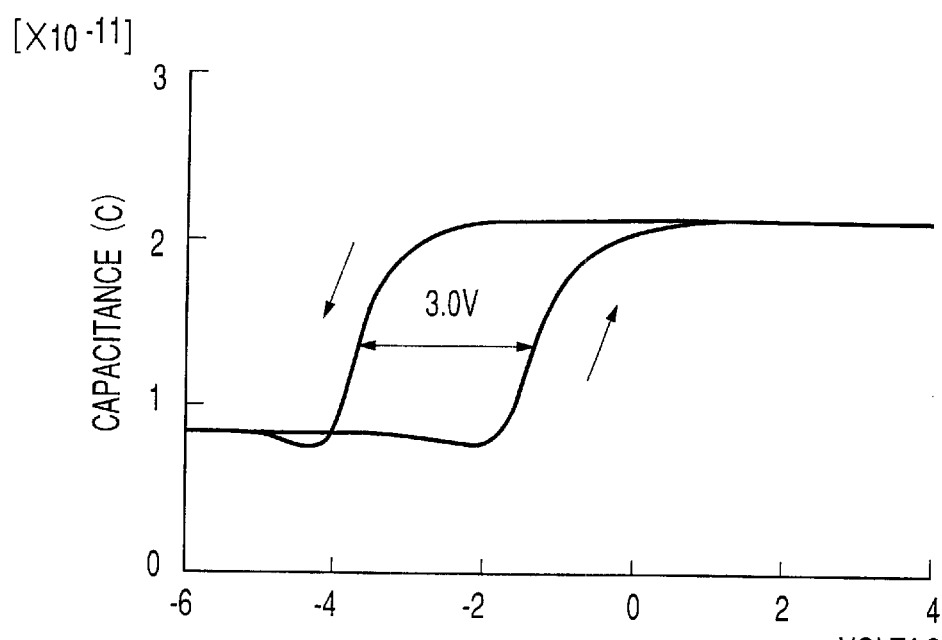

In this structure, the lower $n^+$-region 13 serves as the source or drain of a MOSFET, the p-region 14 serves as its channel, and the conductive electrode 61 serves as its drain or source. FIG. 7 shows a circuit equivalent to that of this structure, which differs from the circuit of FIG. 4 in that, in the former, the source and drain wires of each MOSFET intersect each other. If the conductive electrodes 61 are made of metal silicide or a pure metal, a MOSFET whose one electrode is of Schottky barrier type is created.

When forming the conductive electrodes 61, n-type impurity atoms such as atoms of P or As, etc. may be mixed beforehand in the corresponding film, thereby diffusing them into the Si thin film stripes 10 by a heat treatment. In this case, the lower n+-region 13 serves as the source or drain of a MOSFET, the p-region 14 serves as its channel, and an n+-region formed of impurity atoms diffused from the conductive electrode 61 serves as its drain or source.

This embodiment also can have a wide gate width, and hence provide the same advantage as in the first embodiment.

The present invention is not limited to the above-described embodiments. Although the embodiments employ PZT as the dielectric material of the ferroelectric capacitor, any other ferroelectric material can be used as the material of the ferroelectric capacitor. Moreover, the field effect transistor is not limited to a MOSFET, but may assembled by a MIS-FET that uses an insulation film other than an oxide film as the gate insulation film. Furthermore, the Si stripes are not limited to the npn type. When forming a p-channel transistor, pnp type is employed. In addition, the invention can be modified in various ways without departing from its scope.

As described above in detail, in the present invention, source, channel and drain regions are formed in the thickness direction of the Si thin film in the SOI structure, and gate electrodes are provided, via gate insulation films, in holes formed in the Si thin film. As a result, the gate width of the MOS- or MIS-FET can be increased without reducing the degree of integration. This means that the nonvolatile ferroelectric memory, in which MOS- or MIS-FETs are connected to ferroelectric capacitors, can have an optimal element structure of high performance.

As described above, a highly integrated nonvolatile ferroelectric memory according to the invention can be used as a high capacity memory device for use in various types of electronic apparatuses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile ferroelectric memory comprising:
   an insulated substrate;
   a MOS-type or MIS-type field effect transistor assembled by a silicon thin film formed in stripes on the insulated substrate; and
   at least one ferroelectric capacitor provided on the silicon thin film, which assembles the transistor, in a thickness direction of the silicon thin film, the at least one ferroelectric capacitor being connected to a gate of the transistor,
   wherein source, channel and drain regions of the transistor are formed in the thickness direction of the silicon thin film.

2. The nonvolatile ferroelectric memory according to claim 1, wherein the silicon thin film has a laminated structure in which a first-conductivity-type first region, a second-conductivity-type second region and a first-conductivity-type third region are formed in this order from the bottom in the thickness direction of the silicon thin film; an insulation film is provided on a side wall of a hole formed in the silicon thin film and at least extending to the first-conductivity-type first region; the first-conductivity-type third region and the first-conductivity-type first region are used as a source and drain of the transistor, respectively; the second-conductivity-type second region is used as the channel of the transistor; and the insulation film on the side wall of the hole is used as a gate insulation film.

3. The nonvolatile ferroelectric memory according to claim 1, wherein: the silicon thin film has a laminated structure in which a first-conductivity-type first region and a second-conductivity-type second region are formed in this order from the bottom in the thickness direction of the silicon thin film; a conductive electrode is provided on the silicon thin film in a direction substantially perpendicular to a direction in which the silicon thin film is formed in stripes; an insulation film is provided on a side wall of a hole formed in an intersection between the silicon thin film in stripes and the conductive electrode, extending from an upper surface of the conductive electrode at least to the first-conductivity-type first region; the first-conductivity-type first region is used as a source or drain of the transistor; the second-conductivity-type second region is used as the channel of the transistor; the conductive electrode is used as the drain or source of the transistor; and the insulation film on the side wall of the hole is used as a gate insulation film.

4. The nonvolatile ferroelectric memory according to claim 3, wherein the conductive electrode contains an impurity that serves as a donor or acceptor with respect to silicon, the first-conductivity-type region is formed by diffusing the impurity, contained in the conductive electrode, into the thin film, and the first-conductivity-type first region is used as the drain or source of the transistor.

5. A nonvolatile ferroelectric memory comprising MOS-type or MIS-type field effect transistors and one or a plurality of ferroelectric capacitors connected to gates of the transistors,
   wherein the transistors are assembled by:
      a number of multi-layered silicon thin films formed in a row direction on an insulated substrate and each having a first-conductivity-type first region, a second-conductivity-type second region and a first-conductivity-type third region in a thickness direction;
      gate insulation films formed on side walls of holes that are selectively formed in the silicon thin films and extend to the first-conductivity-type first regions; and
      gate electrodes formed on the gate insulation films, and the ferroelectric capacitors are formed on the silicon thin films and have electrodes connected to the gate electrodes.

6. A nonvolatile ferroelectric memory comprising:
   an insulated substrate including a silicon wafer and an oxide film formed on the silicon wafer;
   field effect transistors assembled by: a multi-layered silicon thin film including a first-conductivity-type first region, a second-conductivity-type second region and a first-conductivity-type third region formed in this order on the insulated substrate; a plurality of silicon stripes formed by forming grooves in selected portions of the silicon thin film; gate insulation films formed on peripheral surfaces of a plurality of holes cyclically formed in the silicon stripes and at least extending to the second regions; and gate electrodes formed on the gate insulation films; and
   ferroelectric capacitors formed of first electrodes connected to the gate electrodes, ferroelectric films and second electrodes, which are layered on the holes of the silicon thin film.

7. The nonvolatile ferroelectric memory according to claim 6, wherein the second electrodes of the ferroelectric capacitors extend in a direction perpendicular to the silicon stripes.

8. The nonvolatile ferroelectric memory according to claim 6, further comprising a protective insulation film that protects the silicon stripes, and insulation films provided in the holes and the grooves.

9. The nonvolatile ferroelectric memory according to claim 6, wherein the holes formed in the silicon stripes are rectangular holes extending to the oxide film, and the gate electrodes are rectangular corresponding to the rectangular holes.

10. The nonvolatile ferroelectric memory according to claim 6, wherein the first-conductivity-type first region, the second-conductivity-type second region and the first-conductivity-type third region are an $n^+$-region, a p-region and an $n^+$-region, respectively.

11. A nonvolatile ferroelectric memory comprising:

field effective transistors formed of: an SOI substrate including a silicon thin film that has a first-conductivity-type region and a second-conductivity-type region layered in this order; a plurality of silicon stripes formed by forming grooves in selected portions of the silicon thin film; silicon oxide films filling the grooves; conductive electrodes arranged in stripes substantially perpendicular to the silicon stripe and formed of polysilicon; gate insulation films formed on surfaces of holes selectively formed in the silicon stripes; and gate electrodes formed of polysilicon filling the holes coated with the gate insulation films, the first-conductivity-type region, the second-conductivity-type region and the conductive electrodes being used as sources, channels and drains of the field effect transistors, respectively; and ferroelectric capacitors formed of a ferroelectric layer formed on the gate electrodes and capacitor electrodes formed on the ferroelectric layer.

12. A method of forming a nonvolatile ferroelectric memory, comprising the steps of:

preparing an SOI (Silicon on Insulator) substrate including a silicon thin film that is formed on a silicon wafer and has a first-conductivity-type first region and a second-conductivity-type second region layered in this order on an oxide film;

forming a first-conductivity-type third region in the second-conductivity-type second region;

forming a silicon oxide film on the first-conductivity-type third region;

etching the silicon thin film into stripes and forming holes, for forming gate sections, which extend to the oxide film, using a mask having openings in stripes and rectangular holes;

forming gate insulation films on peripheral surfaces of the holes;

depositing gate electrode films on the gate insulation films;

filling the holes and the grooves between the silicon stripes with a silicon film;

forming electrodes of ferroelectric capacitors on the gate electrodes; and depositing ferroelectric films on the electrodes.

13. The method according to claim 12, wherein the gate electrode films are formed of polysilicon films doped with an impurity and having a low resistance.

* * * * *